United States Patent [19]

Basset

[11] 3,845,393

[45] Oct. 29, 1974

[54] COMMUNICATION RECEIVER WITH TUNING CIRCUITS THAT TRACK THE L.O.

[75] Inventor: Jean-Claude Basset, Paris, France

[73] Assignee: U.S. Philips Corporation, New York, N.Y.

[22] Filed: Mar. 14, 1973

[21] Appl. No.: 340,955

[30] Foreign Application Priority Data

Mar. 17, 1972 France .............................. 72.09445

[52] U.S. Cl................... 325/453, 325/417, 325/421, 325/422, 325/423, 325/457, 325/459, 325/462, 325/464, 325/468, 178/DIG. 15, 334/15, 334/16, 331/1 A

[51] Int. Cl. ............................................. H04b 1/06

[58] Field of Search............ 325/346, 349, 420–423, 325/452, 453, 457, 458, 459, 462, 464, 465, 468, 469, 416–423; 178/DIG. 15; 334/16, 26, 28, 15; 331/11, 17, 18, 25, 1 A

[56] References Cited

UNITED STATES PATENTS

| | | | |
|---|---|---|---|
| 3,223,943 | 12/1965 | Dumaire et al. | 331/17 |
| 3,416,096 | 12/1968 | Kim | 331/11 |
| 3,496,473 | 2/1970 | Seppeler et al. | 325/346 |
| 3,704,423 | 11/1972 | Kadron et al. | 325/458 |
| 3,753,141 | 8/1973 | Elk et al. | 331/17 |
| 3,753,142 | 8/1973 | Nardin et al. | 331/17 |

*Primary Examiner*—Albert J. Mayer
*Attorney, Agent, or Firm*—Frank R. Trifari; Henry I. Steckler

[57] ABSTRACT

A receiver has a synthesized L.O. A code converter is coupled to it and causes the R.F. tuned circuits to track the frequency of the L.O.

7 Claims, 3 Drawing Figures

Figure 1:
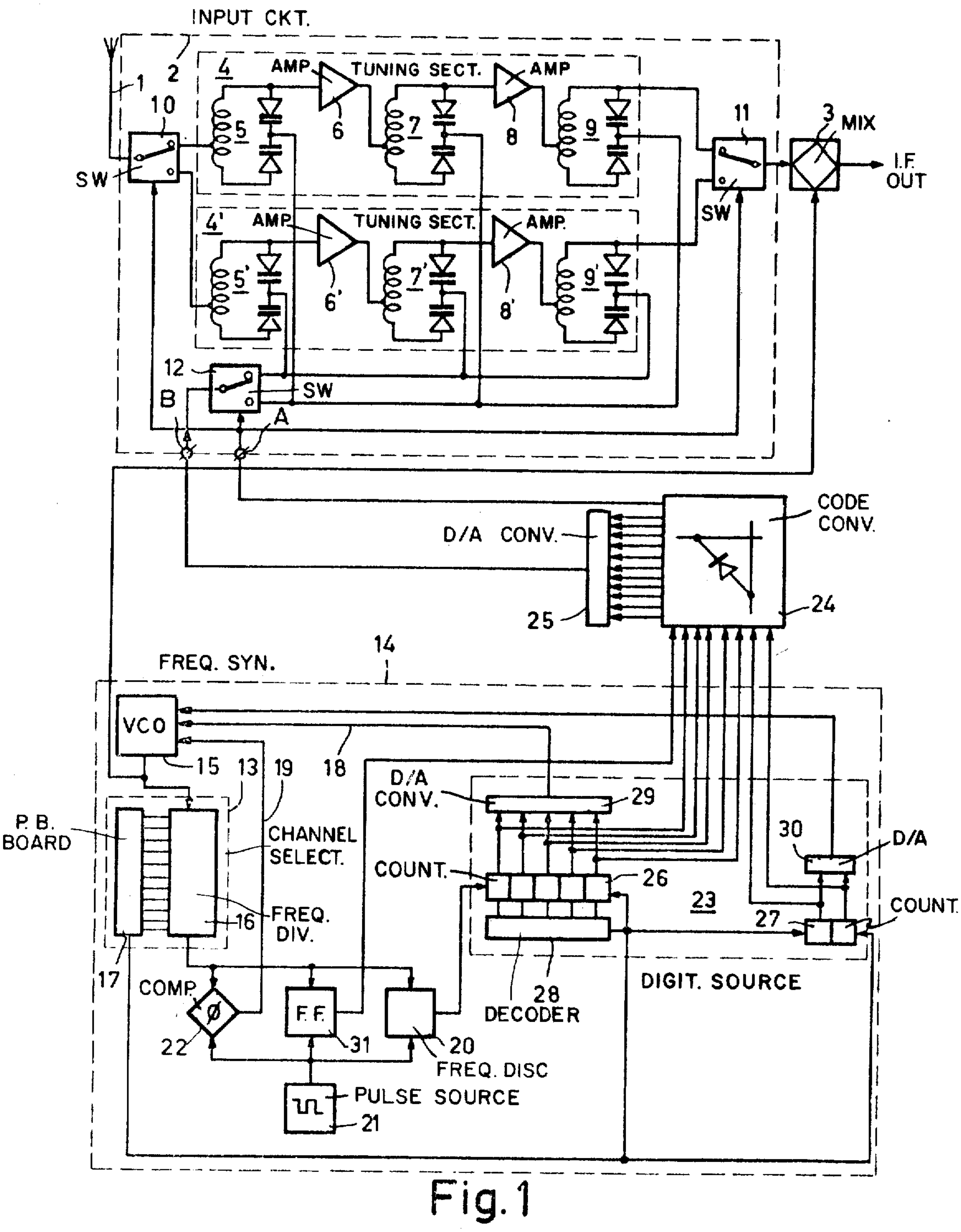

COMMUNICATION RECEIVER WITH TUNING CIRCUITS THAT TRACK THE L.O.

The invention relates to a communication receiver comprising a tunable input circuit whose tuning is determined by a tuning voltage applied to a tuning control input of said receiver input circuit, and an intermediate frequency stage connected to the output of said input circuit to which stage a local oscillator signal is applied which is derived from a synthesizer provided with a channel selector unit and being constituted by a voltage-controlled oscillator (VCO) which is incorporated in a coarse and a fine tuning control loop, the tuning voltages applied to said receiver input circuit and to said oscillator being mutually different, while for tuning to a desired channel each one of these voltages can be varied in accordance with the associated tuning curve dependent on the adjustment of said channel selector unit.

Communication receivers of the kind described above are known and are very easy to operate due to the use of a channel selector unit. The channel selector unit generally has a number of push-buttons by which the correct tuning can be automatically found for any desired receiver channel. Although the use of electronically controllable reactances such as, for example, variable capacity diodes considerably facilitates the realisation of such automatically tunable receivers, it is difficult in practice that the voltage-frequency tuning curve of the tunable receiver input circuit must be adapted to the voltage-frequency tuning curve of the voltage-controlled oscillator of the synthesizer. This adaptation is particularly difficult due to the fact that the tuning frequency of the receiver input circuit and the tuning frequency of the voltage-controlled oscillator providing the local oscillator signal are different; this frequency difference being equal to the intermediate frequency of the receiver. To realise the above-mentioned adaptation it is known to use a plurality of adjusting potentiometers which are connected in parallel with a generally stabilised supply voltage. The wipers on the potentiometer are then each connected through a separate switch to a common lead leading to the tuning control input of the tunable receiver input circuit. The channel selector unit of the synthesizer also operates the said switches in such a manner that for a given channel selection also a given switch is closed and the voltage of the associated wiper brought to the desired value by the pre-adjustment of this wiper is applied to the tuning control input of the receiver input circuit.

An object of the invention is to provide a communication receiver of the kind described in the preamble which ensures a very accurate tuning of the receiver input circuit, which tuning is also quite insensitive to supply voltage variations and temperature influences.

According to the invention such a communication receiver is to this end provided with means incorporated in the oscillator coarse tuning control loop which means supplies a digital signal representative of the oscillator course tuning control voltage determined by the channel selector unit, the receiver being furthermore provided with a code converter to which at least said digital signal is applied and whose output circuit constituted by a digital-to-analog converter, is connected to the tuning control input of said receiver input circuit, said code converter being adapted for converting the oscillator coarse tuning voltage into the associated tuning voltage for the said receiver input circuit.

When using the steps according to the invention the code conversion provides the possibility of obtaining a very accurate mutual adaptation of the tuning curve of the receiver input circuit to the tuning curve of the oscillator, moreover the advantage is obtained that the tuning of the receiver input circuit is substantially not affected by supply voltage and/or temperature variations because the tuning voltage applied to the receiver input circuit is derived from a voltage in a controlled circuit which counteracts the unwanted influence of the tuning caused by such variations.

Figure 2A:
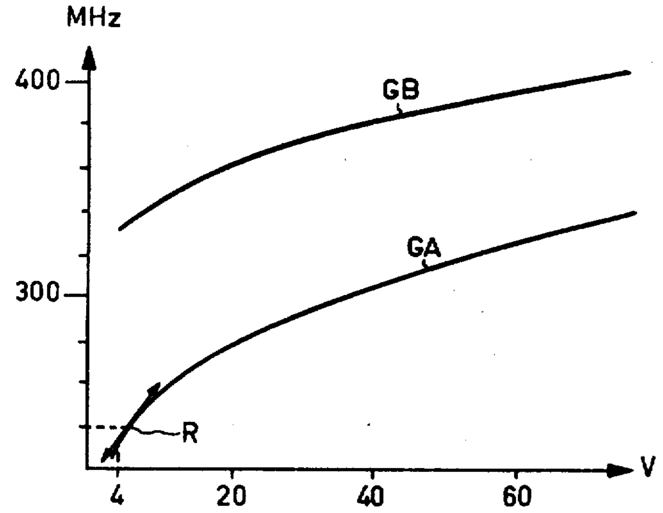
Figure 2B:
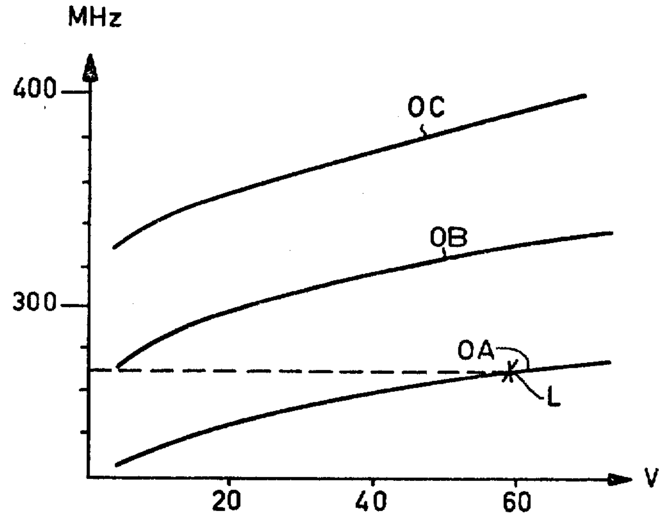

The invention and its advantages will now be described in greater detail with reference to the drawing in which FIG. 1 shows a possible embodiment of a communication receiver according to the invention, FIG. 2*a* shows the voltage-frequency tuning curve of the voltage-controlled oscillator as used in a synthesizer forming part of the receiver according to the invention, while FIG. 2*b* shows the voltage-frequency tuning curve of the tunable input circuit of the communication receiver according to the invention shown in FIG. 1.

The communication receiver shown in FIG. 1 comprises a tunable input circuit 2 connected to an aerial 1 and having its output connected to a mixer stage 3 to which also a local oscillator signal is applied in order to bring the signal selected with the aid of said tunable receiver input circuit to the intermediate frequency level. The intermediate frequency signal occurring at the output of the mixer stage 3 may furthermore be converted in a conventional manner into a signal suitable for reproduction. The demodulator filters and amplifiers required for this purpose are well known and have been omitted for the sake of simplicity in the Figure because they are irrelevant for the further description.

In the embodiment shown the receiver input circuit 2 is split up into two mutually separate sections 4, 4' for realising a large tuning range, each section being constituted by the cascade arrangement of a first parallel resonant circuit 5, 5'; a first high-frequency amplifier 6, 6'; a second parallel resonant circuit 7, 7'; a second high-frequency amplifier 8, 8' and a third parallel resonant circuit 9, 9'.

Said parallel resonant circuits are each formed by a coil having an electronically controllable reactance connected in parallel therewith and consisting of two variable capacity diodes. The receiver input circuit is furthermore provided with three two-position switches 10, 11, 12 which are simultaneously operated by a common switching signal occurring at the terminal A. When the said switches are in the position shown in the Figure the upper cascade arrangement (section 4) is active as a receiver input circuit. This receiver input circuit can be tuned by a tuning voltage applied to the terminal B, which tuning voltage is applied in parallel through the switch 12 to the variable capacity diodes of the parallel resonant circuits 5, 6, 7. The tuning of the receiver input circuit may then be varied in accordance with the tuning curve denoted by GA in FIG. 2*a*. FIG. 2*a* further shows that the tuning range denoted by the curve GA adjoins the tuning range shown in FIG. 2*a* by the tuning curve GB; the latter tuning range may be switched on by bringing the two-position switches 10, 11 and 12 to the position not shown and the lower cascade arrangement (section 4') then operates as a receiver input circuit in which case the tuning voltage is applied in parallel through the switch 12 to the variable capacity diodes of the resonant circuits 5', 7' and 9'.

The local oscillator signal applied to the mixer stage 3 is derived from a synthesizer 14 provided with a channel selector unit 13. This synthesizer comprises a voltage-controlled oscillator (VCO) 15 which operates as a local oscillator. The channel selector unit 13 in the given embodiment comprises a frequency divider 16 connected to the output of the voltage-controlled oscillator 15. The division ratio of the frequency divider can be adjusted by operating a push-button board 17. The oscillator 15 is incorporated in coarse and fine tuning control loops 18 and 19, respectively. The coarse tuning control loop 18 comprises a frequency discriminator 20 to which the output signal from the frequency divider and the output signal from a reference pulse source 21 are applied for generating the coarse tuning control signal to be applied to the oscillator. The fine tuning control loop is provided with a phase comparator 22 to which the output signal from the frequency divider 16 and the output signal from said reference pulse source 21 are applied for generating the fine tuning control signal to be applied to the oscillator 15. The oscillator can be tuned with the aid of these tuning voltages over a total tuning range which is subdivided into three adjoining sub-ranges whose voltage-frequency tuning curves in FIG. *2b* are denoted by OA, OB and OC, respectively. When these tuning curves are compared with the tuning curves of FIG. *2a* associated with the receiver input circuit, it is found that they have a mutually different variation.

Consequently, the tuning voltages applied to the said receiver input circuit and to the said oscillator must be mutually different and for tuning to a desired channel it must be possible to vary each of their associated tuning curves dependent on the adjustment of the said channel selector unit.

According to the invention a very accurate adaptation of the respective tuning curves is obtained if the oscillator coarse tuning control loop 18 is provided with an arrangement 23 which supplies a digital signal representative of the oscillator coarse tuning voltage determined by the channel selector unit, and if the receiver is furthermore provided with a code converter 24 to which at least the said digital signal is applied and whose output circuit constituted by a digital-to-analog converter 25 is connected to the tuning control input B of said receiver input circuit, said code converter 24 being adapted for converting the oscillator coarse tuning voltage into the associated tuning voltage for the said receiver input circuit.

In the embodiment shown in FIG. 1 the arrangement 23 includes two up-down counters 26 and 27 both of which are brought to the up-counting or down-counting position by a command signal derived from the channel selector unit 13, dependent on the sense of direction of the frequency variation brought about by the adjustment of the channel selector unit. A final position decoder 28 is connected to the counter 26, which decoder supplies an output pulse whenever the counter 26 reaches the maximum or the minimum counting position and which pulse is applied as an up-counting or down-counting command to the counter 26 and also to the input of the counter 27. The output pulses from the discriminator 20 are applied to the input of the counter 26. Furthermore counter 26 is provided with a digital-to-analog converter 29 connected to its output and the output of this converter is connected to the oscillator coarse tuning input. The counter 27 is likewise provided with a digital-to-analog converter 30 connected to its output and the output of this converter is connected to an input of the oscillator 15.

The operation of the arrangement 23 is as follows: let it be assumed that the counters 23 and 27 are brought to the up-counting position by the command signal generated in the channel selector unit and that the discriminator 20 supplies output pulses which are applied to the counter 26 and which result from the fact that there is a frequency difference between the output signal from the frequency divider 16 and the output signal from the reference pulse source 21. For every pulse applied to the counter 26, the contents of this counter increase by one unit so that the coarse tuning voltage occurring at the output of the digital-to-analog converter 29 increases stepwise. When the contents of the counter 26 have reached their maximum value the decoder 28 connected to this counter supplies an output pulse which brings the counter 26 to its down-counting position. This output pulse is also applied to the counter 27 so that the contents of this counter increase by one unit resulting in the voltage applied through the digital-to-analog converter 30 to the oscillator 15 increasing so that the oscillator is changed over to a subsequent tuning sub-range. The process described is repeated until the frequency discriminator 20 no longer supplies any output pulses. The contents of the counter 26 then have a digital value which is representative of the analog coarse tuning voltage applied to the oscillator 15. This digital value is applied as a digital signal to the code converter 24. This code converter is of the non-linear type and causes the digital signal which is representative of the coarse tuning voltage to be converted into a digital signal which is representative of the tuning voltage for the receiver input circuit associated with the said oscillator coarse tuning voltage, which voltage occurs at the output of the digital-to-analog converter 25 connected to the converter. In the embodiment shown, where the oscillator 15 is tunable in different tuning ranges the digital signal applied to the code converter 24 must of course also indicate in which tuning sub-range the oscillator 15 is active. To this end the contents of the counter 27 whose digital value indicates the relevant tuning sub-range is added to the digital signal applied to the code converter 24.

A very accurate tuning is obtained by converting the fine tuning voltage occurring at the output of the phase comparator 22 into a digital signal and by subsequently adding this digital signal to the digital signal which is representative of the coarse tuning voltage and which is applied to the code converter 24.

In the embodiment shown in FIG. 1 the digital representation of the fine tuning voltage is not obtained by applying this fine tuning voltage to an analog-to-digital converter, but a D-flipflop 31 is used to which the output signal from the frequency divider 16 and the output signal from the reference pulse source 21 are applied. This flip-flop provides a "0" or a "1" signal dependent on whether the phase difference between these input signals lies between 0 and $\pi$ or between $\pi$ and $2\pi$.

The code converter 24 used in the embodiment of FIG. 1 is constituted by a read-only memory. This read-only memory is formed in such a manner that for each digital signal of 8 bits which are applied in parallel to the code converter a digital output signal of 12 bits is supplied one bit of which serves for the simultaneous operation of the switches 10, 11 and 12 of the receiver input circuit, while the other 11 bits are converted with the aid of the digital-to-analog converter 25 into the analog tuning voltage for the receiver input circuit.

FIG. 2*b* shows for the purpose of further illustration a point L on the tuning curve OA whose ordinate indicates the frequency (270 MHz) of the signal supplied by the voltage-controlled oscillator 15.

The associated tuning frequency (240 MHz) of the receiver input circuit is shown in FIG. 2*a* by the ordinate of the point R on the tuning curve GA. The frequency difference (30 MHz) between these two frequencies is equal to the first intermediate frequency of the receiver.

A given tuning voltage is associated with the frequency given by the ordinate of the point L in FIG. 2*b*. The digital representation of this tuning voltage is accurate up to 1 bit, namely the bit which varies with the fine tuning voltage from the value 0 to the value 1 and conversely. This variation causes an error which is not more than 0.5 MHz.

Or the 12 bits occurring at the output of the code converter 24, 11 are decisive of the value of the tuning voltage which is applied to the receiver input circuit. The value of this tuning voltage is 4 Volt at a minimum which is indicated by the code converter by 11 bits each having a value of "0". The value of the tuning voltage is 76.8 Volt at a maximum which is indicated by the code converter by 11 bits each having a value of "1". It follows that the tuning voltage can increase or decrease 35 mV at a maximum when the bit of the slightest weight changes its value. FIG. 2*a* shows that the tuning voltage which is necessary to tune the receiver input circuit at 240 MHz is equal to 6 Volt (see point R on curve GA), while at point R the derivative of the curve GA is 2 MHz/Volt. In order to effect tuning of the receiver input circuit with the same accuracy as the tuning of the oscillator, namely 0.5 MHz, it is found that this accuracy in frequency for the point R corresponds to a voltage variation of 0.5/2 = 0.25 V. This variation of 0.25 Volt may be provided by modifying the digital signal at the input of the digital-to-analog converter 25; this modification corresponds to the number: 0.25/0.035 = 7, i.e. the number 111 in the binary system.

Consequently, when the digital signal occurring at the output of the code converter can be represented by the bits 000001 10010, the digital signal applied to the code converter consists of the bits 00111001 (sum of the previous number and of the number 111). The above clearly illustrates that the invention makes it possible to realize a very accurate tuning of the receiver input circuit in spite of the fact that the voltage-frequency tuning curve has a steep variation. In this respect it is to be noted that the code converter constituted by a read-only memory may alternatively be a code converter constituted by a programmable memory (P.R.O.M.). Finally it is to be noted that the receiver according to the invention can be advantageously used in a transceiver adapted for simplex traffic in which it must be possible to vary the tuning quickly when the transceiver switch is operated.

What is claimed is:

1. A circuit comprising a first tuned circuit having a voltage variable reactance element having a first voltage versus frequency characteristic; a frequency synthesizer including a voltage controlled oscillator having a second control voltage verses frequency characteristic differing from said first characteristic, and a first control loop having means for generating a digital signal representative of a selected frequency coupled to said oscillator; and means for tracking the resonant frequency of said tuning tuned circuit with the oscillation frequency of said voltage controlled oscillator, said tracking means comprising means coupled to said digital generating means for code converting said digital signal into another digital signal compatible with said first characteristic, and a digital to analogue converter coupled to said code converter and said element.

2. A circuit as claimed in claim 1, wherein said first control loop generates a course frequency control voltage and further comprising a second frequency control loop for applying a fine frequency control voltage to said oscillator, means coupled to second loop for supplying a digital signal which is representative of the fine frequency control voltage applied to the oscillator, means coupled to said loops and said code converter for adding the signal which is representative of the fine frequency control voltage to the digital signal which is representative of the coarse frequency control voltage.

3. A circuit as claimed in Claim 1, wherein said generating means includes an up-down counter, and said first loop includes a frequency discriminator having an output coupled to said counter.

4. A circuit as claimed in claim 1, wherein the code converter comprises a read-only memory.

5. A circuit as claimed in claim 1 wherein said first tuned circuit is tuned to a first subrange of said oscillator and said generating means comprises means coupled to said code converter for applying a digital signal representative of a subrange, and further comprising a second tuned circuit tuned to a second subrange, said code converter having output means for providing a subrange indication signal, and switching means coupled to said tuned circuits and having a control input means coupled to said output means.

6. A method for tracking the resonant frequency of a tuned circuit having a voltage variable reactance element having a first voltage versus frequency characteristic, a voltage controlled oscillator having a second voltage versus frequency characteristic differing from said first characteristic, said method comprising the steps of generating a first digital signal from said VCO signal, controlling the VCO with said first digital signal; code converting said first digital signal used to control the frequency of said oscillator into a second digital signal compatible with said second characteristic, converting said second digital signal into an analogue signal, and applying said analogue signal to said reactance element.

7. A method as claimed in claim 6 further comprising controlling said oscillator frequency using a third digital signal to effect fine frequency control, and adding said first and third signals before said code converting step.

* * * * *